United States Patent
Hwang

(10) Patent No.: US 11,047,908 B2
(45) Date of Patent: Jun. 29, 2021

(54) DEVICE AND METHODS FOR REDUCING PEAK NOISE AND PEAK POWER CONSUMPTION IN SEMICONDUCTOR DEVICES UNDER TEST

(71) Applicant: Samsung Electronics Co., Ltd., Suwon-si (KR)

(72) Inventor: Jong-tae Hwang, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/227,424

(22) Filed: Dec. 20, 2018

(65) Prior Publication Data
US 2020/0049765 A1 Feb. 13, 2020

(30) Foreign Application Priority Data
Aug. 7, 2018 (KR) .................. 10-2018-0092053

(51) Int. Cl.
*G01R 31/28* (2006.01)
*G01R 31/317* (2006.01)
(Continued)

(52) U.S. Cl.
CPC ... *G01R 31/31721* (2013.01); *G01R 31/3177* (2013.01); *G01R 31/31701* (2013.01);
(Continued)

(58) Field of Classification Search
CPC .......... G01R 31/001; G01R 31/31701; G01R 31/31718; G01R 31/31723;
(Continued)

(56) References Cited

U.S. PATENT DOCUMENTS 5,682,472 A * 10/1997 Brehm .............. G11C 29/56 714/25
6,324,485 B1 * 11/2001 Ellis ............... G01R 31/31905 702/108
(Continued)

FOREIGN PATENT DOCUMENTS

JP   2005-147679   6/2005
JP   2011-029535   2/2011
(Continued)

OTHER PUBLICATIONS

Agrawal et al. "A Distributed, Reconfigurable, and Reusable BIST Infrastructure for Test and Diagnosis of 3-D Stacked ICs" IEEE Transactions on Computer-Aided Design of Integrated Circuits and Systems 35(2):309-322 (2016).
(Continued)

*Primary Examiner* — Albert Decady
*Assistant Examiner* — Osman M Alshack
(74) *Attorney, Agent, or Firm* — Myers Bigel, P.A.

(57) ABSTRACT

A test device includes a test mounting circuit having a plurality of semiconductor devices mounted thereon as respective devices-under-test. Each device-under-test includes a corresponding delay control circuit and a target circuit therein. Test logic is provided, which is electrically coupled to the test mounting circuit. The test logic is configured to generate a test input(s), which is provided in parallel to the delay control circuits within the plurality of devices-under-test. The delay control circuits include at least first and second delay control circuits, which are configured to pass the test input(s) to corresponding first and second target circuits during respective first and second test time intervals that are out-of-phase relative to each other in order to achieve more uniform power consumption requirements of the test mounting circuit during testing.

13 Claims, 12 Drawing Sheets

(51) Int. Cl.
  *G01R 31/3177* (2006.01)
  *G01R 31/3185* (2006.01)
  *G01R 31/319* (2006.01)

(52) U.S. Cl.
  CPC .. *G01R 31/31723* (2013.01); *G01R 31/31908* (2013.01); *G01R 31/31917* (2013.01); *G01R 31/318566* (2013.01)

(58) Field of Classification Search
  CPC .......... G01R 31/31721; G01R 31/3177; G01R 31/318566; G01R 31/31908; G01R 31/31917
  USPC .......... 714/718, 724, 725, 726, 727
  See application file for complete search history.

(56) References Cited

U.S. PATENT DOCUMENTS

| | | | |
|---|---|---|---|
| 6,356,490 B1 * | 3/2002 | Matsuo | G11C 29/48 365/201 |
| 6,499,121 B1 | 12/2002 | Roy et al. | |
| 6,507,801 B1 | 1/2003 | Oh et al. | |
| 6,642,734 B1 * | 11/2003 | Tsuyuki | G01R 31/31917 324/756.06 |
| 7,046,563 B1 | 5/2006 | Kim | |
| 7,759,716 B2 | 7/2010 | Baek et al. | |
| 7,979,760 B2 | 7/2011 | Kim et al. | |
| 8,242,589 B2 | 8/2012 | Saen et al. | |
| 8,310,855 B2 | 11/2012 | Riho | |
| 8,326,565 B2 | 12/2012 | Daub et al. | |
| 9,036,435 B2 | 5/2015 | Park et al. | |
| 9,165,624 B2 | 10/2015 | Byeon | |
| 9,405,506 B2 | 8/2016 | Ryu et al. | |
| 2004/0044938 A1 * | 3/2004 | Heo | G11C 29/56004 714/738 |
| 2004/0216006 A1 * | 10/2004 | Kim | G11C 29/56 714/30 |
| 2005/0234674 A1 | 10/2005 | Bundy et al. | |
| 2008/0030218 A1 * | 2/2008 | Kang | G01R 31/31932 324/756.07 |
| 2008/0080261 A1 | 4/2008 | Shaeffer et al. | |
| 2009/0055690 A1 * | 2/2009 | Puente | G06F 11/273 714/48 |
| 2009/0058454 A1 * | 3/2009 | An | G01R 31/31924 324/764.01 |
| 2009/0295404 A1 * | 12/2009 | Matsumoto | G01R 31/31937 324/555 |
| 2010/0052724 A1 * | 3/2010 | Mizuno | G01R 31/31703 324/750.3 |
| 2013/0047047 A1 | 2/2013 | Whetsel | |
| 2013/0102091 A1 * | 4/2013 | King | G01R 31/01 438/5 |
| 2014/0063887 A1 | 3/2014 | Vogelsang | |
| 2014/0111243 A1 | 4/2014 | Kumar Goel et al. | |
| 2014/0269119 A1 | 9/2014 | Na | |
| 2015/0377967 A1 * | 12/2015 | Thiruvengadam | G01R 31/3171 714/731 |
| 2016/0034371 A1 | 2/2016 | Oh et al. | |
| 2016/0284423 A1 | 9/2016 | Lee et al. | |
| 2017/0103930 A1 | 4/2017 | Lee | |
| 2017/0236597 A1 | 8/2017 | Kondo et al. | |
| 2017/0316990 A1 | 11/2017 | Masai | |
| 2020/0049767 A1 | 2/2020 | Kim et al. | |

FOREIGN PATENT DOCUMENTS

| | | |
|---|---|---|
| JP | 2013-072762 | 4/2013 |
| KR | 10-0340715 | 6/2002 |
| KR | 10-0599348 | 7/2006 |
| KR | 10-2007-0114964 | 12/2007 |
| KR | 10-0909969 | 7/2009 |
| KR | 10-0669546 | 1/2017 |

OTHER PUBLICATIONS

Lu et al. "Efficient test and repair architectures for 3D TSV-based random access memories" 2013 International Symposium on VLSI Design, Automation, and Test (VLSI-DAT) (4 pages) (Apr. 2013).

* cited by examiner

DEVICE AND METHODS FOR REDUCING PEAK NOISE AND PEAK POWER CONSUMPTION IN SEMICONDUCTOR DEVICES UNDER TEST

REFERENCE TO PRIORITY APPLICATION

This application claims the benefit of Korean Patent Application No. 10-2018-0092053, filed on Aug. 7, 2018, in the Korean Intellectual Property Office, the disclosure of which is incorporated herein in its entirety by reference.

BACKGROUND

The inventive concept relates to methods of testing semiconductor devices and, more particularly, to test devices and test methods that reduce the occurrence of peak noise and/or peak power consumption during testing, and semiconductor devices on which testing is performed using the test devices and test methods.

Along with the rapid development of electronic industries and demands of users, electronic devices have become more compact, more sophisticated, and support larger capacities. As a result, testing of semiconductor devices included in electronic devices has become more complicated. As an example, in a production test environment, semiconductor devices including tens or hundreds of wafer dies or semiconductor packages may be simultaneously tested as devices-under-test (DUT). And, when the devices-under-test (DUT) correspond to multi-channel and/or high-capacity memory devices, peak noise and/or peak power consumption may be excessive as operating current increases to several tens of amperes (A).

SUMMARY

The inventive concept provides test devices and test methods, which are capable of reducing test performance degradation due to peak noise and/or peak power consumption in a test environment, and semiconductor devices on which testing is performed using the test devices and the test methods.

According to some embodiments of the invention, a test device is provided, which includes a test mounting circuit and test logic. The test mounting circuit includes a plurality of semiconductor devices mounted thereon as respective devices-under-test. Each of these devices-under-test includes a corresponding delay control circuit and a target circuit to be tested therein. The test logic, which is electrically coupled to the test mounting circuit, is configured to generate a test input(s) that is typically provided in parallel to the delay control circuits within the plurality of devices-under-test. These delay control circuits may include at least first and second delay control circuits, which are configured to pass the test input(s) to corresponding first and second target circuits during respective first and second test time intervals that are out-of-phase relative to each other. In particular, the first and second delay control circuits may receive the same test input(s) at the same time from the test logic, yet provide the test input(s) to the first and second target circuits at different times so that a first test mode is commenced within the first target circuit using the test input(s) before or after a second test mode is commenced within the second target circuit using the test input(s).

In some embodiments of the invention, the first delay control circuit may include a timing control circuit that delays a passing of the test input(s) through the first delay control circuit and to the first target circuit by a programmable first delay amount. In addition, this first delay control circuit may be configured to bypass the timing control circuit when output test data generated by the first target circuit is passed through the first delay control circuit. In some further embodiments of the invention, the first delay control circuit may include a first timing control circuit that delays passing of a plurality of portions of the test input(s) therethrough and to the first target circuit by a corresponding plurality of unequal delay amounts.

According to further embodiments of the invention, a method of testing semiconductor devices includes providing a test input(s) to a test mounting circuit having a plurality of equivalent semiconductor devices mounted thereon as devices-under-test that respectively include corresponding delay control circuits and target circuits therein. The test input(s) is then passed from the test mounting circuit to the plurality of delay control circuits within the plurality of devices-under-test. Next, the test input(s) is passed from the plurality of delay control circuits to a corresponding plurality of target circuits to be tested in a staged out-of-sync manner so that a first test mode is commenced within a first one of the target circuits using the test input(s) before or after a second test mode is commenced within a second one of the target circuits using the test input(s). According to some of these embodiments of the invention, the passing includes passing the test input(s) from all of the plurality of delay control circuits to all of a corresponding plurality of target circuits to be tested in a staged out-of-sync manner so that each of the plurality of target circuits is tested with the same test input(s) in an out-of-sync manner relative to all of the other target circuits. In addition, the delay control circuits within the devices-under-test may provide programmable delays to the test input(s). In addition, the passing of the test input(s) from the test mounting circuit may include passing the test input(s) in parallel from the test mounting circuit to the plurality of delay control circuits within the plurality of devices-under-test.

According to another embodiment of the invention, there is provided a test device including: a device under test (DUT) mounting circuit on which a plurality of semiconductor devices are mounted as a DUT; and test logic configured to generate a test input provided to target circuits in the plurality of semiconductor devices and determine whether the DUT is defective based on a test output from the plurality of semiconductor devices. The test logic may be configured to provide the test input to the plurality of semiconductor devices in parallel, and the timing at which the test input is delivered to target circuits in some of the plurality of semiconductor devices is different from a timing at which the test input is delivered to target circuits in some other semiconductor devices.

According to another embodiment of the inventive concept, there is provided a semiconductor device including: a delay control circuit configured to receive a test input provided from an external test logic in a test mode, delay the test input, and output a delayed test input; and a target circuit configured to receive the delayed test input from the delay control circuit. The delay control circuit is configured to delay the test input depending on a delay amount set in response to a delay control signal in the test mode. According to another embodiment of the invention, there is provided a method of testing a semiconductor device including a delay control circuit having a programmable delay amount. This method can include: setting a delay amount of the delay control circuit in response to a delay control signal in a test mode; receiving a test input from an external test logic; performing delay processing on the received test input depending on the set delay amount; and transmitting a delayed test input to a target circuit in the semiconductor device. The timing at which the test input is delivered to the target circuit may be adjusted depending on the set delay amount.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
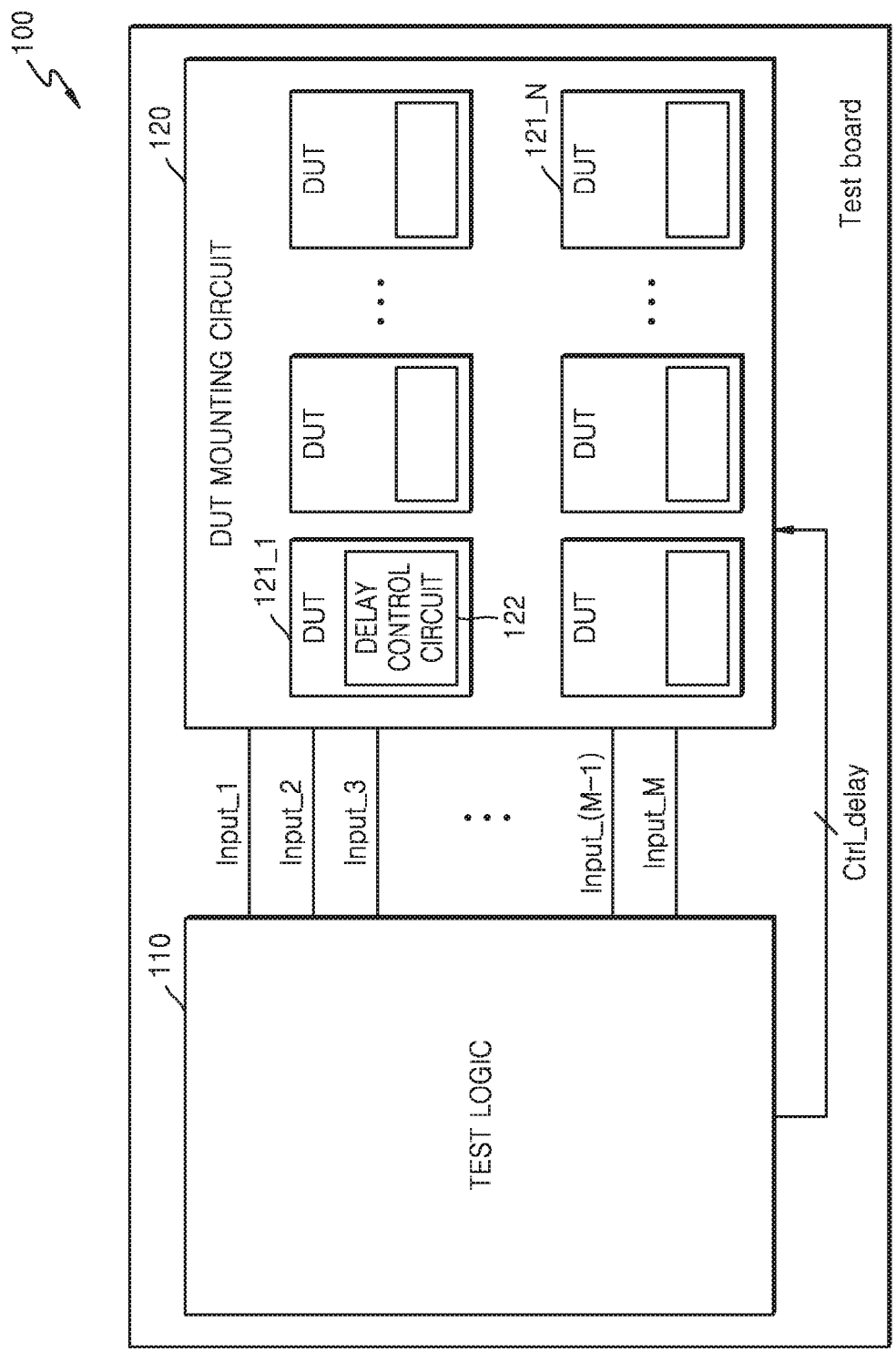
FIG. 1 is a block diagram of a test device according to an example embodiment of the inventive concept.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a test device 100 according to an example embodiment of the inventive concept. Referring to FIG. 1, the test device 100 for testing a semiconductor device may include a tester (or test logic) 110 and at least one device under test (DUT) to be tested. In an embodiment, the test device 100 may include a test board, and the test board may include a DUT mounting circuit 120 on which a plurality of DUTs are mounted. Although FIG. 1 illustrates an example in which the test logic 110 is mounted on the test board, embodiments of the inventive concept are not limited thereto. For example, the test logic 110 may be defined as being located outside the test board.

The DUT mounting circuit 120 may include a plurality of sockets (not shown) on which a plurality of semiconductor devices 121_1 to 121_N are mounted as DUTs, respectively. Although not shown in FIG. 1, the test device 100 may further include a communication device (not shown) for communicating with an external host requesting a test, a memory (not shown) for temporarily storing various types of information related to various tests, and a power supply circuit (not shown) for supplying power to various devices provided in the test device 100. In addition, the test device 100 according to the example embodiment of the inventive concept may be variously defined. For example, in FIG. 1, components other than the plurality of semiconductor devices 121_1 to 121_N may be defined as constituting the test device 100.

According to an embodiment, the test logic 110 may be implemented as a semiconductor chip such as a field programmable gate array (FPGA), an application specific integrated circuit (ASIC), or an application processor (AP) and may transmit and receive various information to and from the semiconductor devices 121_1 to 121_N according to a parallel communication method. For example, the test logic 110 may provide a test input to the DUT mounting circuit 120 through a plurality of channels, and the plurality of semiconductor devices 121_1 to 121_N in the DUT mounting circuit 120 may receive the test input in parallel from the test logic 110.

A test process for determining whether a semiconductor device is defective may be performed at various stages of a semiconductor process and may include, for example, a wafer level test and a test(s) subsequent to wafer level testing. The wafer level test may correspond to a test for individual semiconductor dies at the wafer level. The test after the wafer level test may be a test for a semiconductor die before packaging is performed, or may be a test for a semiconductor package in which one semiconductor die (or semiconductor chip) is packaged. The test for a semiconductor package may be a test for a semiconductor package including a plurality of semiconductor chips. According to an embodiment, when the test device 100 shown in FIG. 1 is a device for performing a wafer level test, the plurality of semiconductor devices 121_1 to 121_N may respectively correspond to a plurality of semiconductor dies formed on a semiconductor wafer, and the DUT mounting circuit 120 may be a device on which a semiconductor wafer is placed. Alternatively, when the test device 100 shown in FIG. 1 is a device for testing a semiconductor package, each of the semiconductor devices 121_1 to 121_N mounted on the DUT mounting circuit 120 may be a semiconductor package.

The semiconductor devices 121_1 to 121_N may be devices that perform various functions. For example, each of the semiconductor devices 121_1 to 121_N may be a memory device including a memory cell array. For example, the memory device may be dynamic random access memory (DRAM) such as double data rate synchronous dynamic random access memory (DDR SDRAM), low power double data rate (LPDDR) SDRAM, graphics double data rate (GDDR) SDRAM, or rambus dynamic random access memory (RDRAM). Alternatively, the memory device may correspond to a nonvolatile memory such as a flash memory, magnetic RAM (MRAM), ferroelectric RAM (FeRAM), phase change RAM (PRAM), or resistive RAM (ReRAM).

According to an embodiment, test inputs Input_1 to Input_M from the test logic 110 may be provided to the semiconductor devices 121_1 to 121_N in the DUT mounting circuit 120 in parallel. Each of the semiconductor devices 121_1 to 121_N may include a delay control circuit 122. The delay control circuit 122 may delay a received test input and provide the delayed test input to a target circuit (not shown) in a semiconductor device. For example, referring to the semiconductor device 121_1, which is a first semiconductor, the delay control circuit 122 may receive and delay a first test input, i.e., the test input Input_1, and transmit the delayed first test input to a target circuit in the first semiconductor device, i.e., the semiconductor device 121_1.

According to an embodiment, the plurality of semiconductor devices 121_1 to 121_N may delay respective test inputs according to different delay amounts. Accordingly, the test inputs Input_1 to Input_M are provided in parallel (or simultaneously) to the DUT mounting circuit 120, whereas the plurality of semiconductor devices 121_1 to 121_N may provide respective test inputs to respective internal target circuits at different points in time. Accordingly, the plurality of semiconductor devices 121_1 to 121_N may perform testing at different timings, thereby dispersing large peak noise that may be caused by simultaneous testing, and thus, degradation of the characteristics of the DUT in a parallel test environment may be prevented.

According to an embodiment, the number of test inputs Input_1 to Input_M may be equal to the number of semiconductor devices 121_1 to 121_N. The number of test inputs Input_1 to Input_M may be greater than or less than the number of semiconductor devices 121_1 to 121_N. For example, when one test input is provided to each of the semiconductor devices 121_1 to 121_N, the number of test inputs Input_1 to Input_M may be equal to the number of semiconductor devices 121_1 to 121_N. When the semiconductor devices 121_1 to 121_N are classified into a plurality of groups and the same test input is provided with respect to each group, the number of test inputs Input_1 to Input_M may be less than the number of semiconductor devices 121_1 to 121_N. When each of the semiconductor devices 121_1 to 121_N includes a plurality of channels communicating through independent interfaces and a separate test input is provided to each channel, the number of test inputs Input_1 to Input_M may be greater than the number of semiconductor devices 121_1 to 121_N.

According to an embodiment, the delay control circuit 122 within each of the semiconductor devices 121_1 to 121_N may delay a test input according to a programmable delay amount. As an example, each of the semiconductor devices 121_1 to 121_N may include an element for generating a delay control signal for setting a delay amount of the delay control circuit 122 and may delay a test input according to the set delay amount during a test mode of operation. In this test mode of operation, the test logic 110 may provide a delay control signal Ctrl_delay to the semiconductor devices 121_1 to 121_N, and each of the semiconductor devices 121_1 to 121_N may set a delay amount in response to the delay control signal Ctrl_delay.

According to an embodiment, as the delay amounts of the delay control circuits 122 of the semiconductor devices 121_1 to 121_N are set differently, the timings at which the test inputs Input_1 to Input_M are provided to the target circuits of the semiconductor devices 121_1 to 121_N may be different from each other, and thus, the timings at which the semiconductor devices 121_1 to 121_N perform testing may be different from each other.

The plurality of semiconductor devices 121_1 to 121_N may be classified into one or more groups, and each group may include one or more semiconductor devices. Furthermore, as the delay amount of the delay control circuit 122 is set differently on a group basis, test inputs may be simultaneously provided to target circuits of semiconductor devices belonging to the same group. For example, delay control circuits 122 of semiconductor devices belonging to the same group may delay test inputs according to the same amount of delay. On the other hand, delay control circuits 122 of semiconductor devices belonging to different groups may delay test inputs according to different amounts of delay.

When any one semiconductor device includes a plurality of channels for receiving test inputs through independent interfaces as described above, a plurality of channels of each of the semiconductor devices 121_1 to 121_N may perform testing at different timings. In an embodiment, each of the semiconductor devices 121_1 to 121_N may include a plurality of delay control circuits 122 respectively corresponding to a plurality of channels and target circuits respectively corresponding to the plurality of delay control circuits 122, and the delay control circuits 122 of the plurality of channels may delay test inputs according to different amounts of delay.

According to the embodiment described above, the semiconductor devices 121_1 to 121_N, which may consume a large amount of current when operating in a parallel test environment, may be prevented from performing the same operation at the same time. Accordingly, a peak current and peak noise of the test device 100 may be reduced and degradation of the characteristics of the DUT may be prevented in a test environment. In addition, since the test inputs Input_1 to Input_M need not be sequentially provided for each semiconductor device from the viewpoint of the test logic 110, a test speed may be prevented from being deteriorated in a parallel test environment.

As the semiconductor devices 121_1 to 121_N sequentially perform a process operation using the test inputs Input_1 to Input_M, the test logic 110 may receive a test result sequentially from the semiconductor devices 121_1 to 121_N of the DUT mounting circuit 120 and may determine whether the semiconductor devices 121_1 to 121_N are defective, based on a logic process. For example, the test logic 110 may determine whether the semiconductor devices 121_1 to 121_N are defective, based on determining whether the patterns of the test inputs Input_1 to Input_M provided to the semiconductor devices 121_1 to 121_N are the same as the patterns of test outputs provided from the semiconductor devices 121_1 to 121_N.

Figure 2:
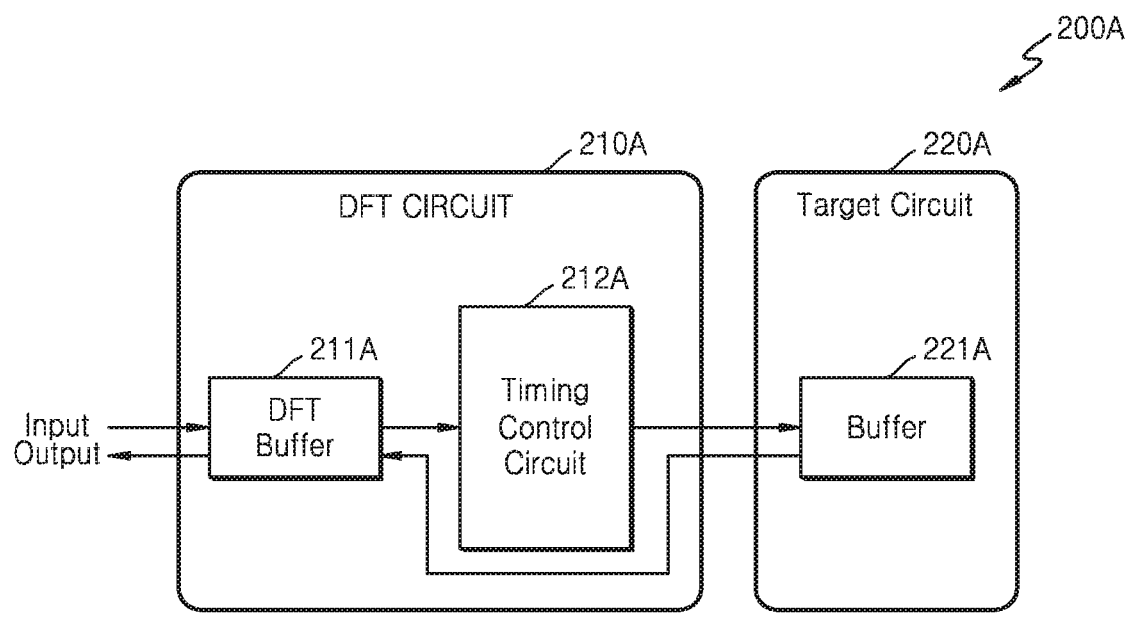
FIGS. 2 and 3 are block diagrams illustrating examples of a delay control circuit provided in a semiconductor device.
Figure 3:
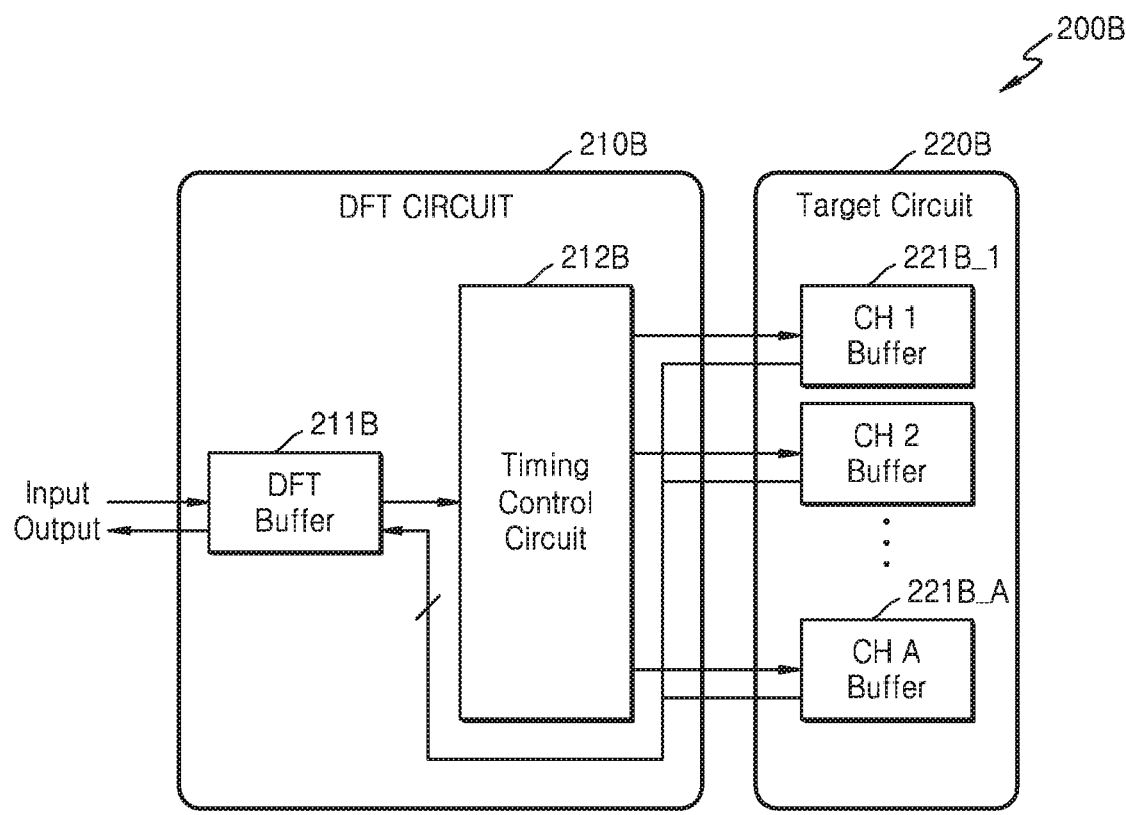

FIGS. 2 and 3 are block diagrams illustrating examples of a delay control circuit provided in a semiconductor device. Referring to FIG. 2, a semiconductor device 200A may include a target circuit 220A that receives a test input and a delay control circuit described above. The delay control circuit may also be referred to as a design for testability (DFT) circuit 210A, which is a circuit for managing a test operation in the semiconductor device 200A. As shown by FIG. 2, a test input Input (e.g., from external test logic) is transmitted to the target circuit 220A via the DFT circuit 210A.

The DFT circuit 210A may include a buffer circuit (e.g., a DFT buffer 211A) for receiving the test input Input from the external test logic and a timing control circuit 212A for receiving the test input Input provided by the DFT buffer 211A and delaying the received test input Input. The target circuit 220A may also include a buffer 221A for receiving the delayed test input, and the buffer 221A may provide the delayed test input to another circuit block (not shown) in the semiconductor device 200A. As an example, when the semiconductor device 200A corresponds to a memory device including a memory cell array therein, the delayed test input may have a pattern to be stored in the memory cell array and may be provided to the memory cell array.

According to an embodiment, the timing control circuit 212A may include a programmable delay circuit, and a delay amount of the timing control circuit 212A may be programmed by various methods such as fuse cutting. For example, a control logic (not shown) for generating a delay control signal according to a mode may be provided in the semiconductor device 200A, and the delay amount of the timing control circuit 212A may be set based on the control of the control logic in a test mode. The delay amount of the timing control circuit 212A may be set as the external test logic described above provides a delay control signal to the semiconductor device 200A.

As an example, a large number of semiconductor devices 200A may be mass-produced, the DFT circuit 210A may be provided in each of the large number of semiconductor devices 200A, and different delay control signals may be supplied to the semiconductor devices 200A in a test mode. Accordingly, the delay amounts of test inputs Input of a plurality of semiconductor devices 200A mounted on one test board may be set differently, and thus, the timings at which the test inputs Input are delivered to target circuits 220A in the plurality of semiconductor devices 200A may be adjusted differently. Therefore, when a test operation is performed in a parallel test environment, the plurality of semiconductor devices 200A may perform testing at different timings regardless of when the test input Input is applied from an external test logic. If a plurality of semiconductor devices 200A are set as one group according to the example described above and semiconductor devices 200A in the same group perform testing at the same timing, the same delay amount may be set in the timing control circuits 212A of the same group of semiconductor devices 200A. On the other hand, for semiconductor devices 200A in different groups, different delay amounts may be set for the groups.

The semiconductor device 200A may perform signal processing using a received test input Input and provide a processing result to an external test logic as a test output Output. As an example, the DFT buffer 211A may include an input buffer and a transmit buffer, and the test input Input received by the input buffer may be provided to the target circuit 220A via the timing control circuit 212A, whereas a test output from the target circuit 220A may be provided to the DFT buffer 211A without going through the timing control circuit 212A.

Although an example in which the target circuit 220A, to which the test input Input is provided, includes the buffer 221A is illustrated in FIG. 2, the target circuit 220A may be variously defined. As an example, when the semiconductor device 200A corresponds to a memory device, the test input Input may be provided via the buffer 221A to various circuit blocks related to memory operations in the memory device, and the target circuit 220A may be defined as including the various circuit blocks. As an example, in accordance with the delay processing of the timing control circuit 212A, the timing at which the test input Input is provided to at least some of the various circuit blocks may be adjusted.

An example in which one semiconductor device 200B includes a plurality of channels is illustrated in FIG. 3.

Referring to FIG. 3, the semiconductor device 200B may include a DFT circuit 210B and a target circuit 220B, and a test input from an external test logic may be provided to the target circuit 220 via the DFT circuit 210B. In addition, the DFT circuit 210B may include a DFT buffer 211B and a timing control circuit 212B. Assuming that the semiconductor device 200B includes A channels, the target circuit 220B may include first to A-th channel buffers 221B_1 to 221B_A.

Although FIG. 3 illustrates an example in which one test input Input is provided to the timing control circuit 212B via the DFT buffer 211B and the timing control circuit 212B branches the test input Input and provides the test input Input to the first to A-th channel buffers 221B_1 to 221B_A, embodiments of the inventive concept are not limited thereto. For example, the DFT circuit 210B may include a plurality of DFT buffers 211B, the external test logic may provide a plurality of test inputs Input respectively corresponding to a plurality of channels to the DFT circuit 210B, and the timing control circuit 212B may perform a delay processing operation on the plurality of test inputs Input. For example, different delay amounts may be applied to the plurality of test inputs Input, and the plurality of test inputs Input may be respectively provided to the first to A-th channel buffers 221B_1 to 221B_A of the target circuit 220B at different timings.

The test inputs Input provided to the first to A-th channel buffers 221B_1 to 221B_A may be independently transmitted to circuit blocks included in the plurality of channels. For example, when the test inputs Input correspond to a pattern to be written to a memory cell array, the test inputs Input may be provided at different timings to memory cell arrays provided in the plurality of channels.

Figure 4A:
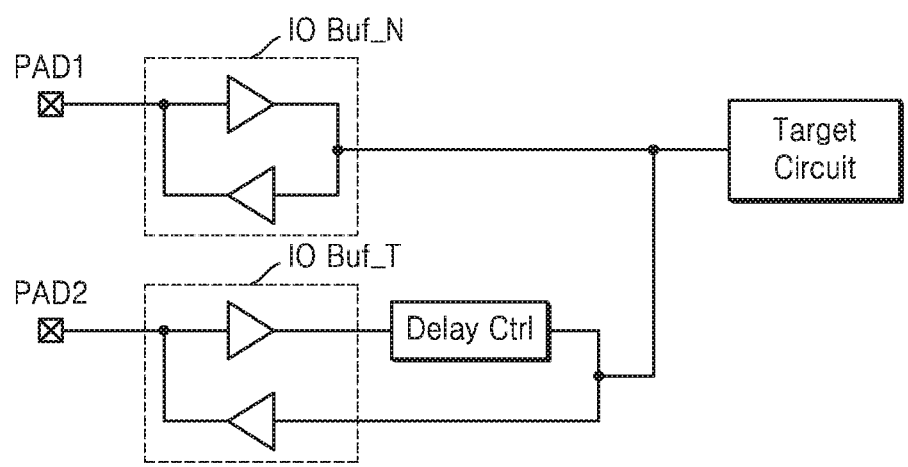
FIGS. 4A and 4B are diagrams illustrating examples of a design for testability (DFT) circuit according to embodiments of the inventive concept.
Figure 4B:
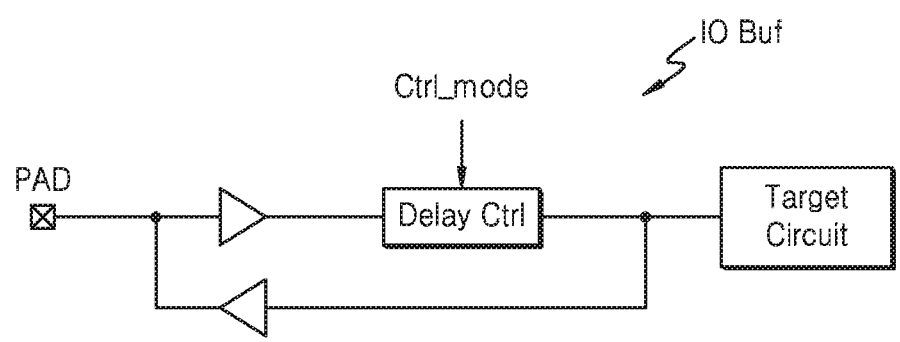

FIGS. 4A and 4B are diagrams illustrating examples of a DFT circuit according to embodiments of the inventive concept. FIG. 4A illustrates a case where a test input in a test mode and a normal input in a normal mode are received via different pads. On the other hand, FIG. 4B illustrates a case where a test input and a normal input are received via the same pad.

Referring to FIG. 4A, a semiconductor device may include a first input/output buffer IO Buf_N for receiving a normal input via a first pad PAD1 in a normal mode and a second input/output buffer IO Buf_T for receiving a test input via a second pad PAD2 in a test mode. Although one first pad (i.e., the first pad PAD1) for receiving a normal input and one second pad (i.e., the second pad PAD2) for receiving a test input are illustrated in FIG. 4A, the semiconductor device may include a plurality of first pads for receiving a normal input and a plurality of second pads for receiving a test input. As an example, the semiconductor device may transmit and receive information through an external memory controller and the first pad PAD1, and may transmit and receive information through a tester (or test logic) and the second pad PAD2.

According to an embodiment, a delay control circuit Delay Ctrl may be placed on a path through which a test input is transmitted via the second input/output buffer IO Buf_T, and the delay amount of the delay control circuit Delay Ctrl may be set in response to a delay control signal in a test mode. As described above, the delay amount of the delay control circuit Delay Ctrl may be set in response to a delay control signal from an external test logic or a control logic in the semiconductor device in a test mode.

A test output may be generated after a certain delay time after the test input is provided to a target circuit. According to an embodiment, the test output may be transmitted to the outside via the second pad PAD2 without passing through the delay control circuit Delay Ctrl.

Referring to FIG. 4B, an input/output buffer IO Buf of a semiconductor device may receive a normal input via a pad PAD in a normal mode. In addition, the input/output buffer IO Buf may receive a test input via the pad PAD in a test mode. In the test mode of the semiconductor device, the delay amount of a delay control circuit Delay Ctrl may be set according to the embodiments described above, and the test input may be provided to a target circuit through the delay control circuit Delay Ctrl.

The input/output buffer IO Buf may be used for receiving the normal input in the normal mode, and the normal input may be provided to the target circuit without delay. According to an embodiment, the delay control circuit Delay Ctrl may receive a mode control signal Ctrl_mode and a delay operation may be enabled or disabled depending on the mode control signal Ctrl_mode. In an example, the mode control signal Ctrl_mode may be generated in a semiconductor device and in a normal mode, the mode control signal Ctrl_mode may include information for disabling the delay control circuit Delay Ctrl, and accordingly, delay processing may not be applied to the normal input. Also, in an embodiment, the delay control circuit Delay Ctrl may include a transmission path (first path) to which a delay is applied and a transmission path (second path) to which a delay is not applied, and may transmit a test input via the first path or a normal input via the second path in response to the mode control signal Ctrl_mode.

Figure 5:
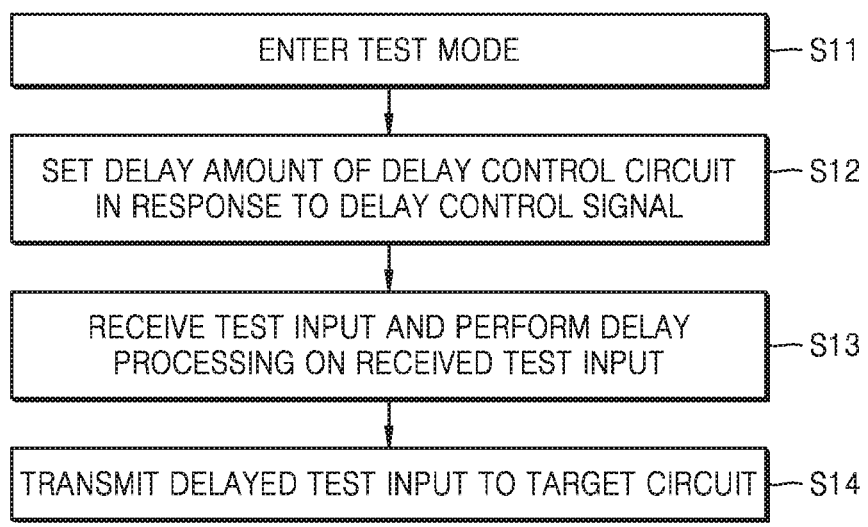
FIGS. 5 and 6 are flowcharts of a method of testing a semiconductor device, according to example embodiments of the inventive concept.
Figure 6:
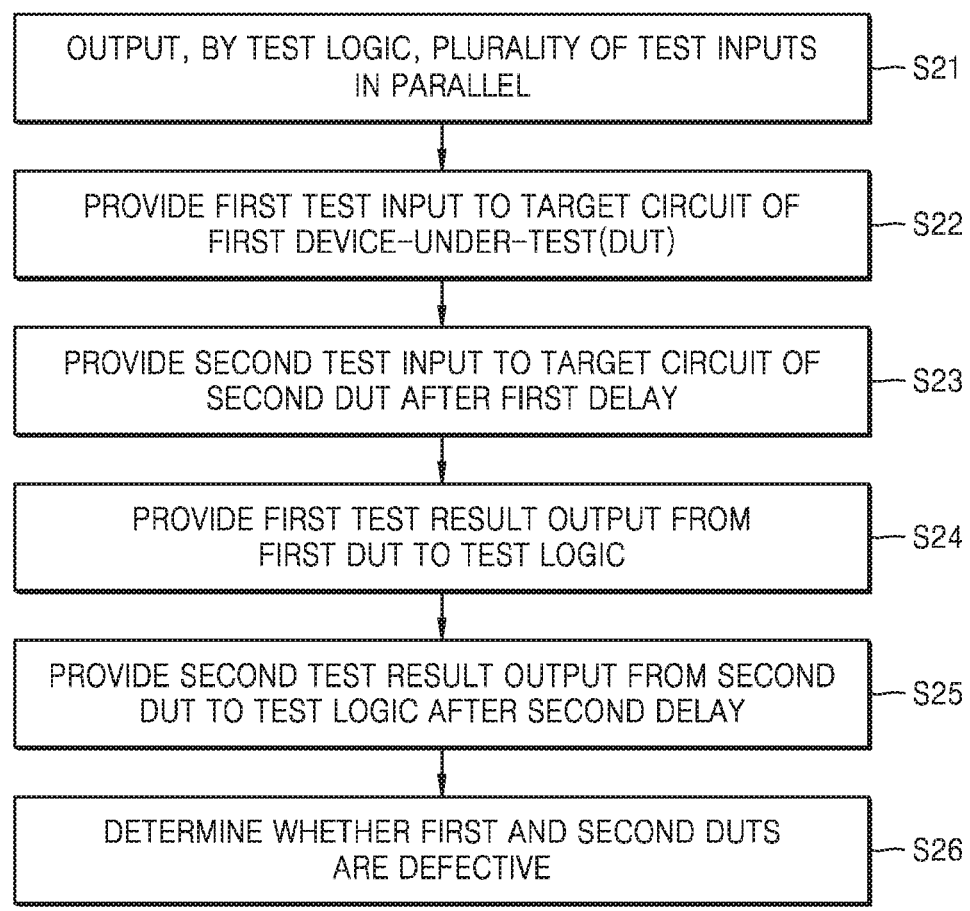

FIGS. 5 and 6 are flowcharts of a method of testing a semiconductor device, according to example embodiments of the inventive concept. Referring to FIG. 5, a wafer level test and/or a test after the wafer level test may be performed in the manufacturing process of the semiconductor device, so that the semiconductor device may enter a test mode based on the control from an external tester (operation S11). In addition, the semiconductor device may include a delay control circuit for performing delay processing on a test input, and the delay amount of the delay control circuit may be programmed in response to a delay control signal. As an example, in a test mode, the semiconductor device may receive a delay control signal from an external tester, and in response to the delay control signal, the delay amount of the delay control circuit may be set (operation S12). As an example, when a plurality of semiconductor devices are mass-produced and the plurality of semiconductor devices are tested by the same tester (or mounted on the same test board), delay amounts applied to the plurality of semiconductor devices may be different from each other.

After the delay amount is set, the semiconductor device may receive a test input from the external tester and perform delay processing on the received test input (operation S13). A delayed test input may be transmitted to a target circuit in the semiconductor device (operation S14). As an example, the target circuit may correspond to one or more various types of circuit blocks, and when the semiconductor device is a memory device and the test input has pattern information to be written to a memory cell array, the delayed test input may be provided to the memory cell array via a data input buffer.

Furthermore, according to the embodiments described above, different delay amounts may be set, based on the delay control signal, for a plurality of semiconductor devices to be tested by the same tester, and accordingly, even if a test input from a tester is provided simultaneously to the plurality of semiconductor devices, the plurality of semiconductor devices may perform signal processing for testing at different timings.

FIG. 6 illustrates an example of the operation of a test device for a test operation according to embodiments of the inventive concept. The test device may include a test logic for generating a test input and a DUT mounting circuit on which a plurality of semiconductor devices are mounted as DUTs, respectively. In the operation example of FIG. 6, a first DUT and a second DUT are illustrated.

The test logic may output a plurality of test inputs in parallel to test a plurality of DUTs (operation S21), and the plurality of test inputs may be simultaneously provided to the DUT mounting circuit. As an example, a first test input may be provided to the first DUT and a second test input may be provided to the second DUT, and the timing at which the first test input is provided to the first DUT and the timing at which the second test input is provided to the second DUT may be substantially the same.

The first DUT may internally perform delay processing on the first test input and then provide the first test input to a target circuit of the first DUT (operation S22). In addition, the second DUT may internally perform delay processing on the second test input and may provide the second test input to a target circuit of the second DUT after a first delay after the first test input is provided to the target circuit of the first DUT, according to a result of internally performing the delay processing on the second test input (operation S23). That is, a difference between a delay amount in the first DUT and a delay amount in the second DUT may correspond to the first delay.

The first DUT may perform internal signal processing by using the first test input, and a first test result from the first DUT may be provided to the test logic (operation S24). In addition, a second test result from the second DUT may be provided to the test logic after a second delay after the first test result is provided to the test logic (operation S25). That is, from the viewpoint of the test logic, although the first test input and the second test input are provided simultaneously to the first DUT and the second DUT, a difference corresponding to the second delay may be generated between the timing of receiving a test result from the first DUT and the timing of receiving a test result from the second DUT.

The test logic may determine whether DUTs mounted on the DUT mounting circuit are defective by using a plurality of test results including the first and second test results (operation S26).

Figure 7A:
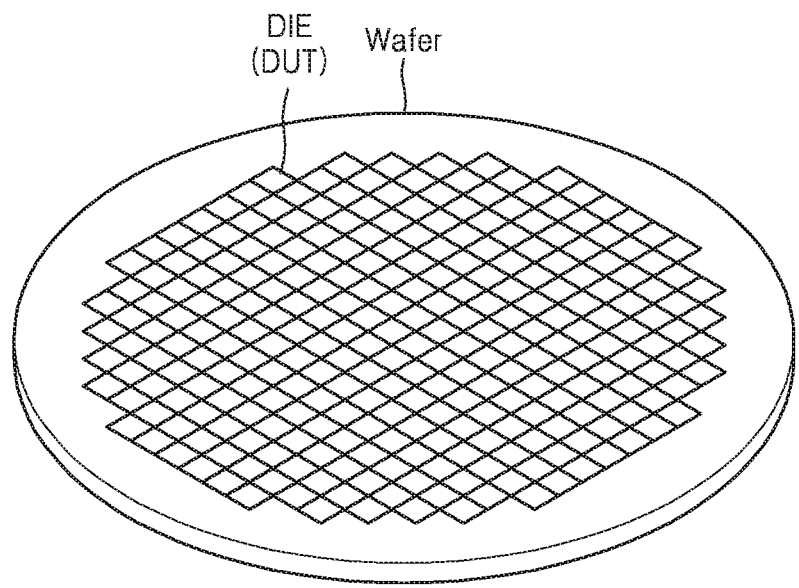
FIGS. 7A and 7B are views illustrating an example of a test operation for a semiconductor wafer according to an example embodiment of the inventive concept.
Figure 7B:
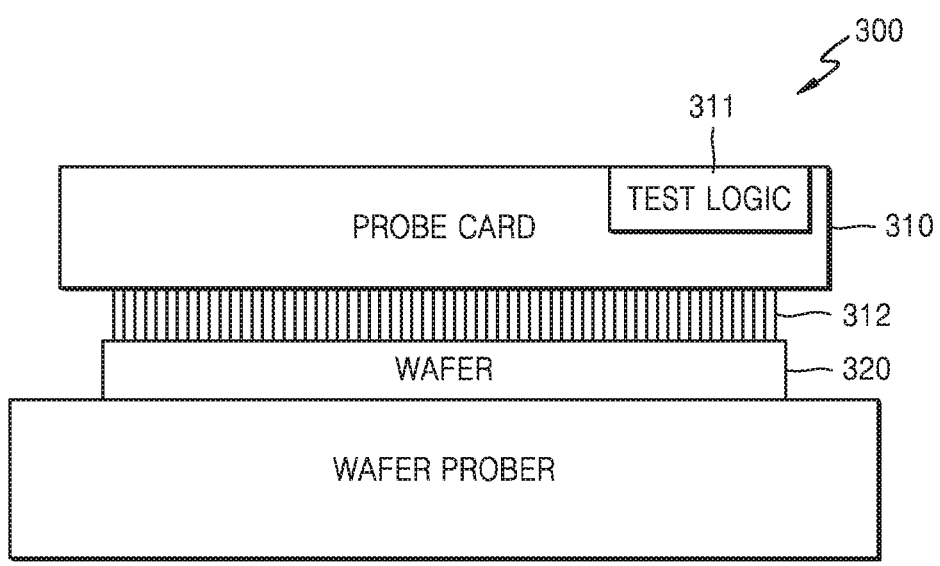

FIGS. 7A and 7B are views illustrating an example of a test operation for a semiconductor wafer according to an example embodiment of the inventive concept. Referring to FIG. 7A, a plurality of semiconductor dies manufactured by a semiconductor manufacturing process on a semiconductor wafer may be arranged in an array, and in a test operation at a wafer level, each of the plurality of semiconductor dies may constitute a DUT. As an example, each of the semiconductor dies may be provided with contact pads (not shown) for electrically connecting internal circuits to external devices. Also, although not shown in FIG. 7A, a delay control circuit for performing delay processing on a test input according to the embodiments described above may be formed in each of the semiconductor dies.

Referring to FIG. 7B, a test device 300 according to an example embodiment of the inventive concept may include a probe card 310 to perform a test at a wafer level, and pins 312 that may be in electrical contact with contact pads of the semiconductor dies may be arranged on one side of the probe card 310. In addition, the test device 300 according to the example embodiment of the inventive concept may include various components, and for example, a plurality of semiconductor dies formed in a semiconductor wafer 320 as test objects may be further included in the test device 300. The semiconductor wafer 320 may be placed on a wafer prober, and the wafer prober may adjust the location of the semiconductor wafer 320 such that contact pads of the semiconductor wafer 320 electrically contact the pins 312 of the probe card 310.

The probe card 310 may have a flat structure including a first surface on which the pins described above are arranged and a second surface on which a logic circuit is formed. As an example, the probe card 310 may be implemented with a printed circuit board and a test logic 311 may be implemented in the second surface or proximity to the second surface.

According to an example embodiment of the inventive concept, the test logic 311 of the probe card 310 may control a test operation on a plurality of semiconductor dies formed in the semiconductor wafer 320. As an example, the test logic 311 of the probe card 310 may provide the semiconductor dies with a delay control signal for adjusting the timing of transmitting a test input provided to the semiconductor dies to a target circuit. According to an embodiment, a plurality of semiconductor dies formed in the semiconductor wafer 320 may be classified into a plurality of groups, and different delay amounts may be set for the plurality of groups. Each of the semiconductor dies may include a plurality of channels, and different delay amounts may be set for the plurality of channels.

Figure 8:
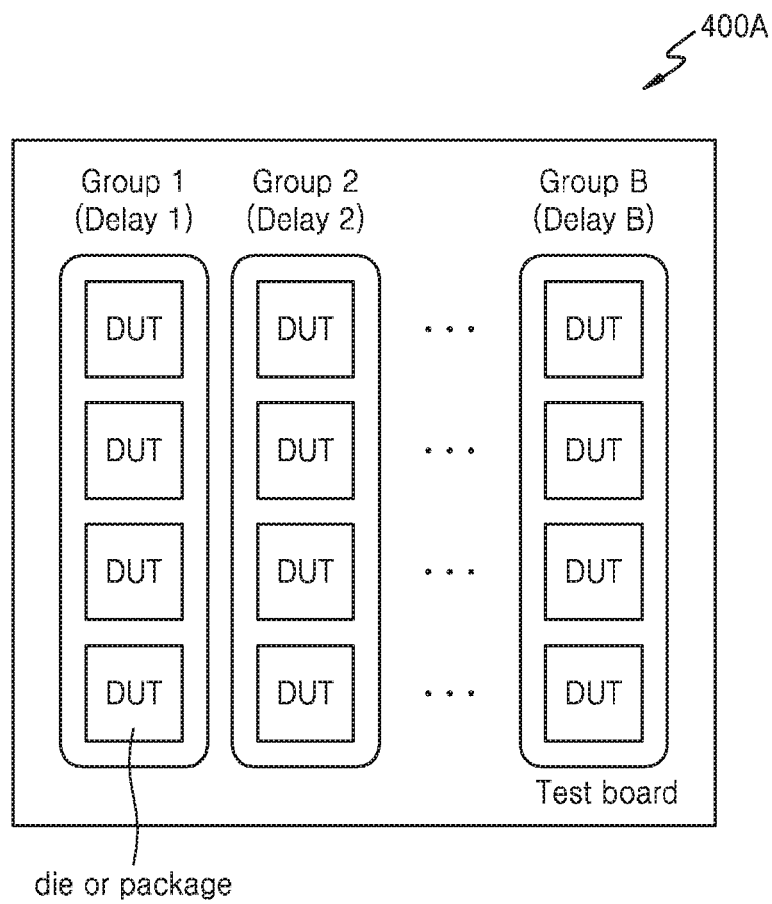
FIGS. 8 and 9 are diagrams illustrating an example of group setting for a plurality of device under tests (DUTs) arranged on a test board and an example of delaying a test input, respectively.
Figure 9:
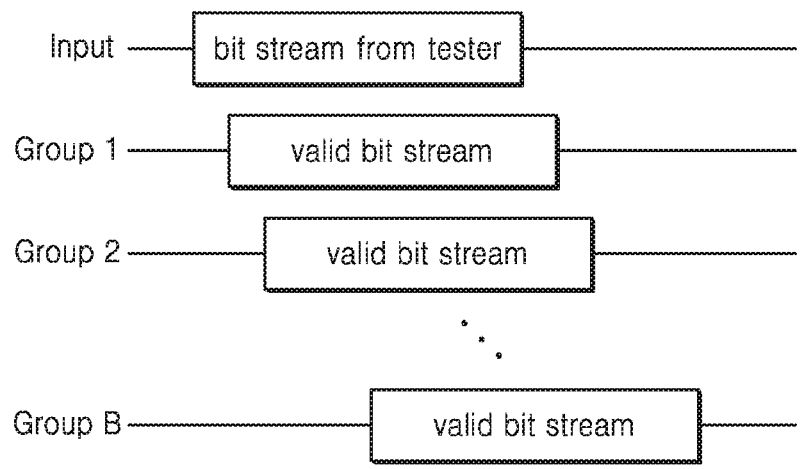

FIGS. 8 and 9 are diagrams illustrating an example of test group setting for a plurality of DUTs arranged on a test board and an example of delaying a test input, respectively. Referring to FIG. 8, a plurality of semiconductor devices are mounted as DUTs, respectively, on a test board provided in a test device 400A. The plurality of semiconductor devices are classified into first to B-th groups Group 1 to Group B, and each of the first to B-th groups Group 1 to Group B may include a plurality of semiconductor devices. In the example of FIG. 8, the first to the B-th groups Group 1 to Group B include the same number of semiconductor devices. However, embodiments of the inventive concept are not limited thereto. For example, the first to the B-th groups Group 1 to Group B may include different numbers of semiconductor devices. In FIG. 8, the DUTs to be tested may be semiconductor dies or semiconductor packages.

FIG. 9 illustrates the timing at which a test input is transmitted to target circuits in the plurality of DUTs mounted on the test board of FIG. 8. As an example, a tester (or test logic) may provide a bitstream having one or more pieces of bit information as a test input to a plurality of semiconductor devices, and the timings at which the test input is provided to the plurality of semiconductor devices may be substantially the same. That is, the tester may provide the test input simultaneously to the plurality of semiconductor devices in a parallel test environment.

According to an embodiment, a delay control circuit of semiconductor devices in the first group Group 1 may delay the test input according to a first delay amount Delay 1, and a delay control circuit of semiconductor devices in the second group Group 2 may delay the test input according to a second delay amount Delay 2. Similarly, a delay control circuit of semiconductor devices in the B-th group Group B may delay the test input according to a B-th delay amount Delay B. A test input with a delay applied thereto and provided to a target circuit may be referred to as a valid bitstream that is effectively provided for testing.

Figure 10:
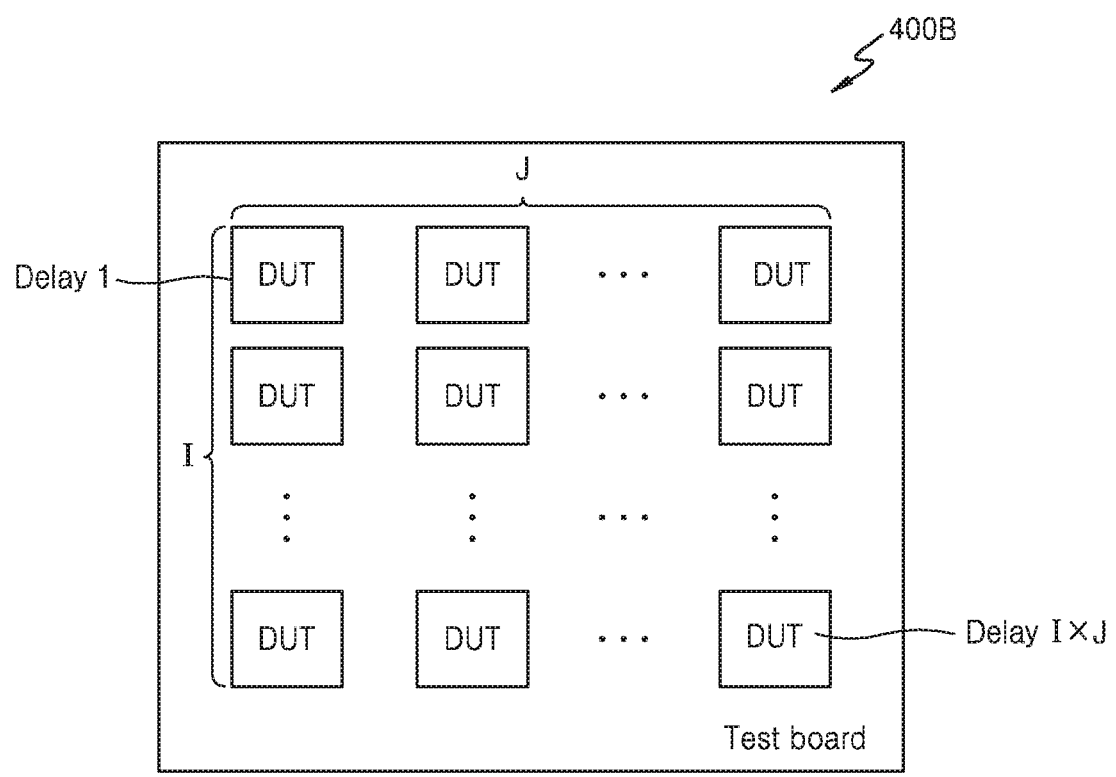
FIGS. 10 and 11 are block diagrams illustrating examples of setting a delay amount for DUTs according to various methods.
Figure 11:
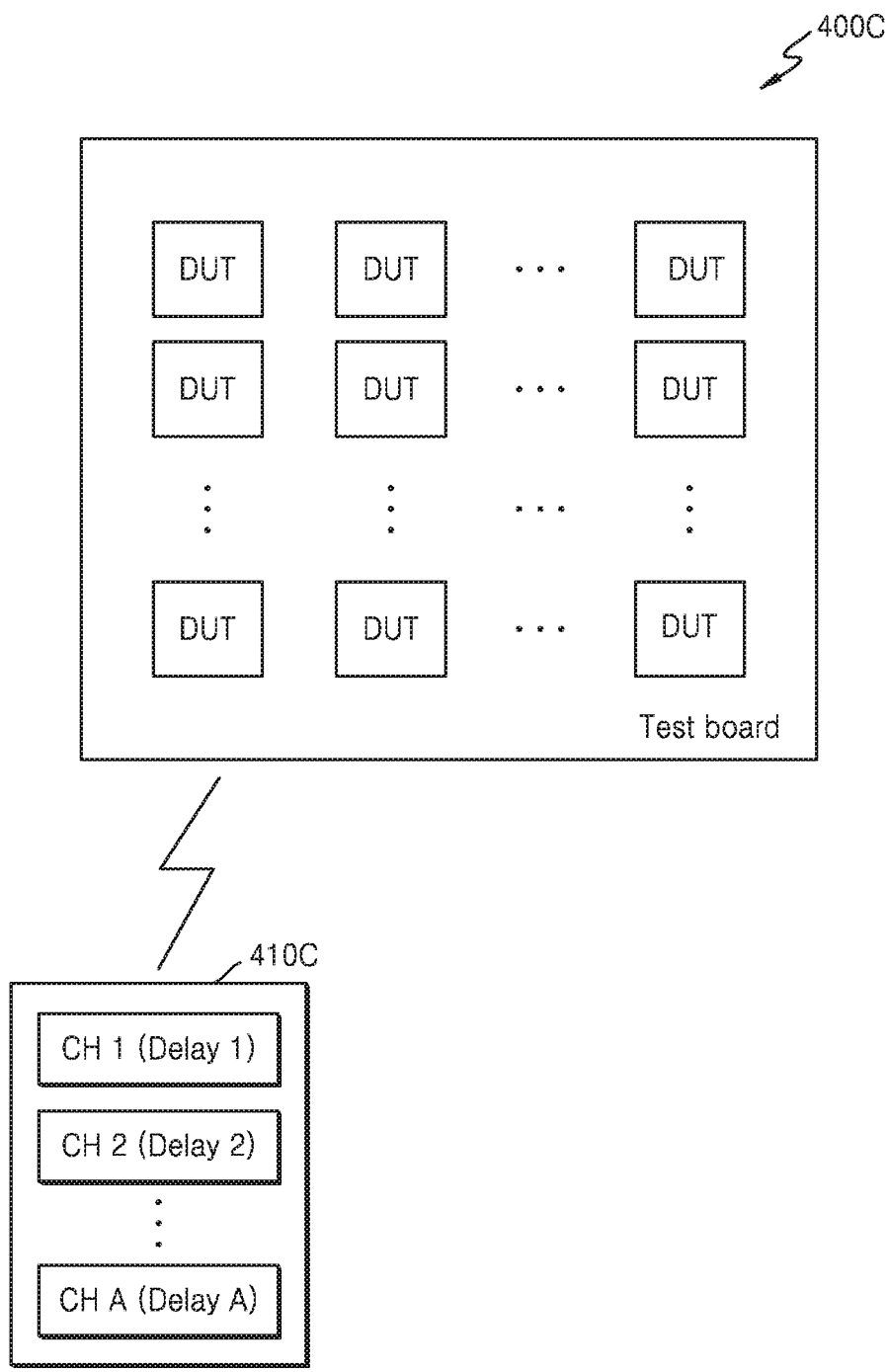

FIGS. 10 and 11 are block diagrams illustrating examples of setting a delay amount for DUTs according to various methods. FIG. 10 illustrates an example in which different delay amounts are set for the DUTs, and FIG. 11 illustrates an example in which different delay amounts are set for channels in one DUT.

Referring to a test device 400B in FIG. 10, a plurality of semiconductor devices are mounted as DUTs, respectively, on a test board. For example, although FIG. 10 illustrates an example in which a plurality of semiconductor devices are arranged in a matrix form, the plurality of semiconductor devices may be arranged in various forms on a test board. As shown in FIG. 10, a plurality of semiconductor devices may be arranged I rows and J columns and thus I*J semiconductor devices may be mounted on the test board, and different delay amounts Delay 1 to Delay I*J may be set for the I*J semiconductor devices. Accordingly, even if a test input is provided at the same point in time to the I*J semiconductor devices mounted on the test board in a parallel test environment, the test input may be delivered at substantially different points in time to target circuits in the I*J semiconductor devices and thus tests for the I*J semiconductor devices may be performed at different points in time.

Referring to a test device 400C of FIG. 11, a plurality of semiconductor devices 410C are mounted as DUTs, respectively, on a test board, and each of the semiconductor devices 410C may include a plurality of channels CH 1 to CH A. According to the embodiments described above, a test input provided to any one semiconductor device 410C may be provided to the plurality of channels CH 1 to CH A in the semiconductor device 410C and the delay amount of the test input may be set differently for the plurality of channels CH 1 to CH A. FIG. 11 illustrates an example in which a first delay amount Delay 1 is set for a first channel, i.e. the channel CH 1, a second delay amount Delay 2 is set for a second channel, i.e., the channel CH 2, and an A-th delay amount Delay A is set for an A-th channel, i.e., the channel CH A. Accordingly, in any one of the semiconductor devices 410C, even if a test input is provided at the same point in time to the plurality of channels CH 1 to CH A, the test input may be delivered at different points in time to target circuits of the plurality of channels CH 1 to CH A.

Figure 12:
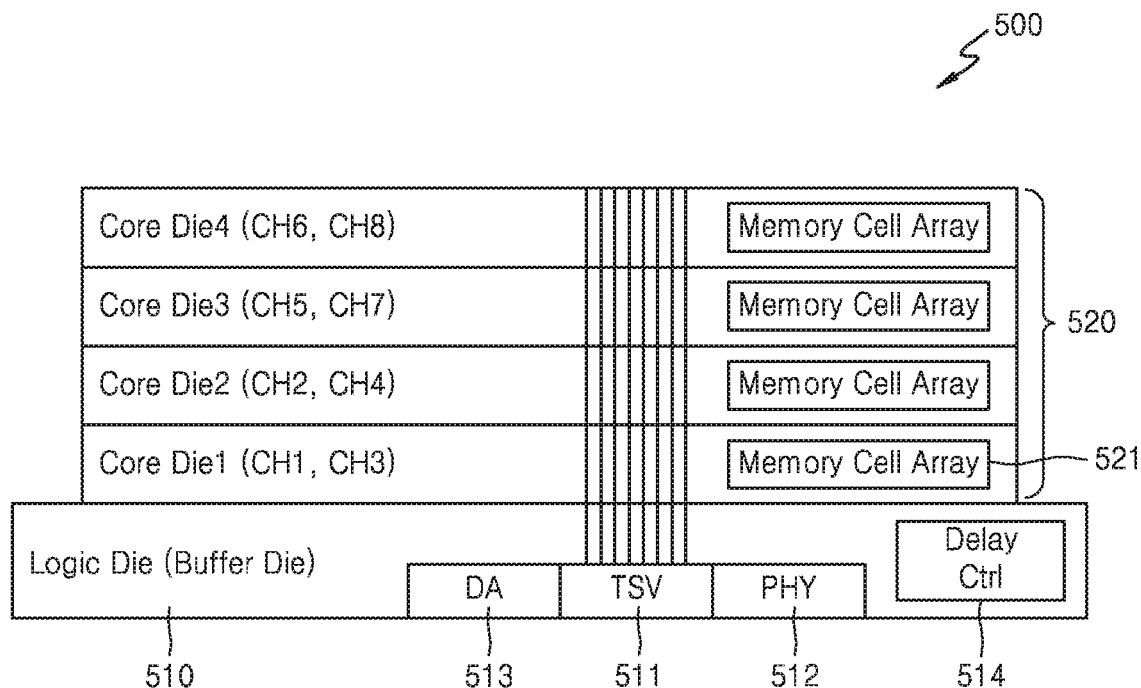
FIG. 12 is a block diagram illustrating an example in which a semiconductor device according to an example embodiment of the inventive concept is implemented as a high bandwidth memory (HBM)

FIG. 12 is a block diagram illustrating an example in which a semiconductor device according to an example embodiment of the inventive concept is implemented as a high bandwidth memory (HBM) 500. Referring to FIG. 12, the HBM 500 may include a plurality of semiconductor dies, for example, a logic die (or buffer die) 510 and one or more core dies 520 including a memory cell array 521. The HBM 500 may have an increased bandwidth by including a plurality of channels CH 1 to CH 8 having independent interfaces, and FIG. 12 illustrates an example in which the HBM 500 includes four core dies 520 and each of the four core dies 520 includes two channels. However, the number of core dies 520 and the number of channels CH 1 to CH 8 may be variously changed.

The logic die 510 may include a through-silicon via (TSV) area 511, a physical (PHY) area 512, and a direct access area 513. The logic die 510 may further include a control logic (not shown) for controlling overall operations in the HBM 500, and may perform, for example, an internal control operation in response to a command from an external controller. In addition, according to the embodiments described above, a delay control circuit 514 for delaying a test input may be further included in the logic die 510.

The TSV area 511 corresponds to an area where a TSV for communication with the core dies 520 is formed. The PHY area 512 may include a plurality of input and output circuits for communicating with an external controller and the direct access area 513 may directly communicate with an external tester via a conductive means positioned on an outer surface of the HBM 500 in a test mode for the HBM 500. Various signals provided from the external tester may be provided to the core dies 520 via the direct access area 513 and the TSV area 511. A test input from the external tester may be provided to the delay control circuit 514 via the direct access area 513 and a delayed test input may be provided to the core dies 520 via the TSV area 511.

According to an example embodiment of the inventive concept, the HBM 500 may be mounted on a test board and receive a test input in a test mode, and as an example, a plurality of HBMs 500 may be mounted on the test board. The delay control circuit 514 may receive a test input commonly provided for the plurality of channels CH 1 to CH 8, delay the test input, and then provide the delayed test input to the plurality of channels CH 1 to CH 8. In another embodiment, the delay control circuit 514 may receive test inputs provided separately for the plurality of channels CH 1 to CH 8 and may output a delayed test input through a delay operation on the test inputs.

According to a further embodiment, a test input may be provided at different timings to target circuits included in the plurality of channels CH 1 to CH 8. The plurality of channels CH 1 to CH 8 may be classified into a plurality of channel groups, and a test input may be provided to the target circuits at different timings for the channel groups. For example, with respect to a first core die Core Die1 and a second core die Core Die2, a test input may be provided to target circuits of first and third channels (i.e., the channels CH 1 and CH 3) of the first core die Core Die1 and then provided to target circuits of second and fourth channels (i.e., the channels CH 2 and CH 4) of the second core die Core Die2. As various example embodiments, a test input may be provided to the target circuits of the channels CH 1 to CH 8 regardless of the stacking order of a plurality of core dies stacked on the logic die 510.

Figure 13:
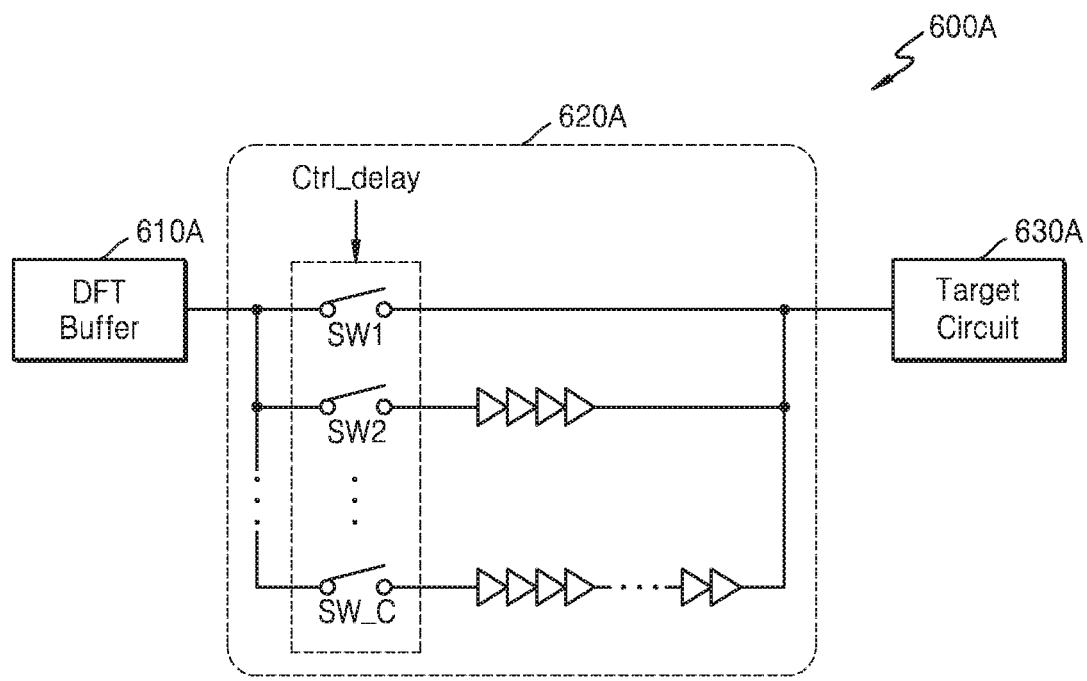
FIGS. 13 and 14 are circuit diagrams illustrating examples of a delay control circuit according to example embodiments of the inventive concept.
Figure 14:
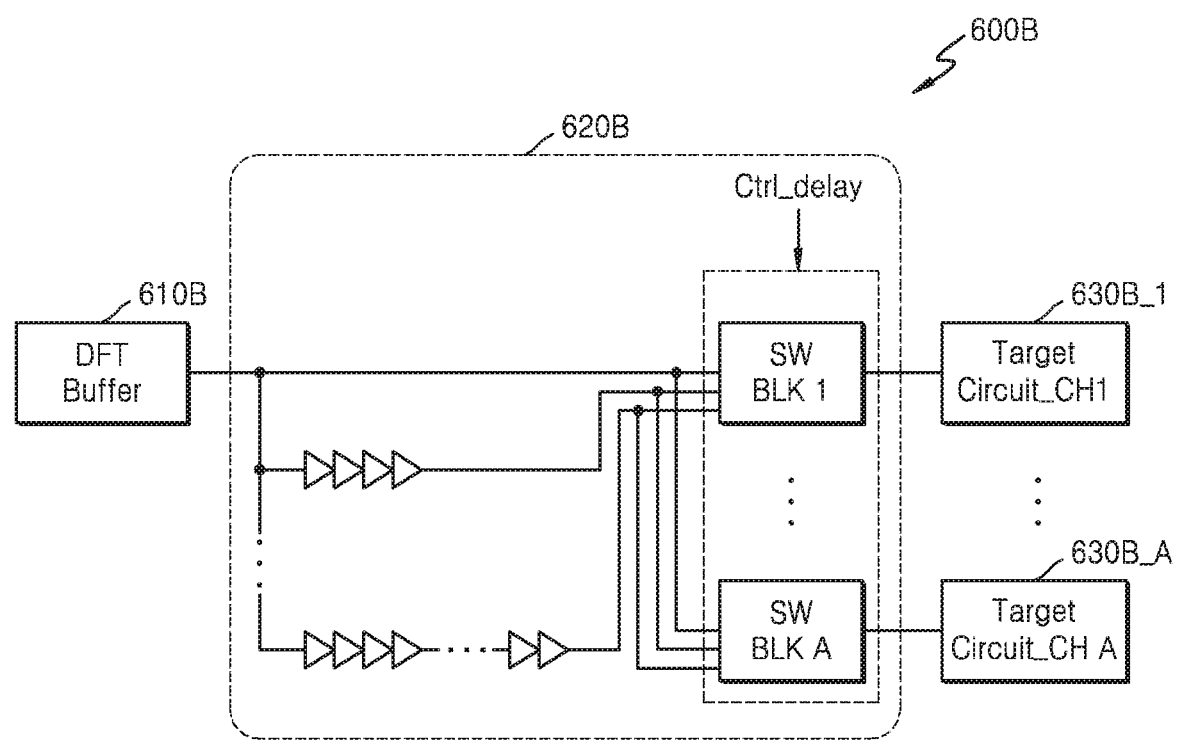

FIGS. 13 and 14 are circuit diagrams illustrating examples of a delay control circuit according to example embodiments of the inventive concept. Referring to FIG. 13, a semiconductor device 600A may include a delay control circuit and a target circuit 630A, and the delay control circuit may include a DFT buffer 610A and a timing control circuit 620A. In addition, the timing control circuit 620A may include a plurality of transmission paths for transmitting a test input to the target circuit 630A, and different delay amounts may be applied to the plurality of transmission paths. In addition, a plurality of switches SW1 to SWC may be further included in the timing control circuit 620A to select any one of the plurality of transmission paths.

The plurality of switches SW1 to SWC may be controlled in response to the delay control signal Ctrl_delay according to the embodiments described above. As an example, the semiconductor device 600A may set a delay amount of the test input by selectively turning on any one of the plurality of switches SW1 to SWC in a test mode. For example, in the test mode of the semiconductor device 600A, any one of the plurality of transmission paths may be selected according to the delay control signal Ctrl_delay from a test logic, whereby the delay amount of the test input may be adjusted.

Referring to FIG. 14, a semiconductor device 600B may include a delay control circuit and target circuits 630B_1 to 630B_A, and the delay control circuit may include a DFT buffer 610B and a timing control circuit 620B. FIG. 14 illustrates an example in which one semiconductor device 600B includes a plurality of channels CH 1 to CH A. As in the embodiment of FIG. 13, the timing control circuit 620B includes a plurality of transmission paths and different delay amounts may be applied to the plurality of transmission paths. The timing control circuit 620B may further include a plurality of switch blocks SW BLK 1 to SW BLK A, which respectively correspond to the plurality of channels CH 1 to CH A, and the plurality of switch blocks SW BLK 1 to SW BLK A may be controlled by a delay control signal Ctrl_delay.

According to an example embodiment, the switching states of the switch blocks SW BLK 1 to SW BLK A in the test mode of the semiconductor device 600B may be controlled differently. Accordingly, paths through which a test input is transmitted to target circuits of the plurality of channels CH 1 to CH A may be different from each other. Accordingly, the timings at which the test input is provided to the target circuits of the plurality of channels CH 1 to CH A of the semiconductor device 600B may be adjusted differently.

Figure 15:
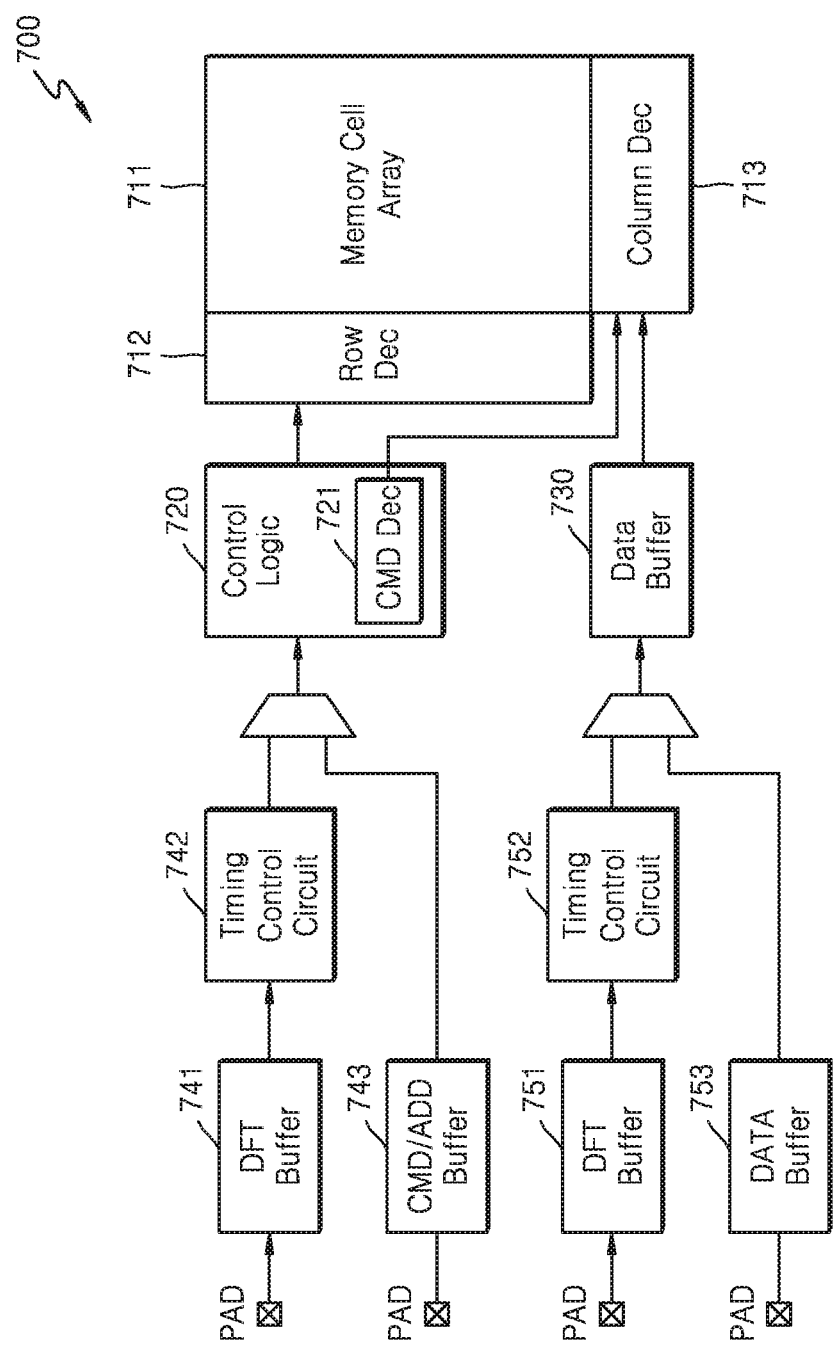
FIG. 15 is a block diagram illustrating an example in which a semiconductor device according to an example embodiment of the inventive concept is implemented as a memory device.

FIG. 15 is a block diagram illustrating an example in which a semiconductor device according to an example embodiment of the inventive concept is implemented as a memory device 700. Referring to FIG. 15, the memory device 700 may include a memory cell array 711, a row decoder 712, and a column decoder 713 to perform memory operations of storing and reading data, 700. The memory device 700 may further include a control logic 720 for controlling overall operations in the memory device 700 and a data buffer 730 for temporarily storing input/output data. In addition, the memory device 700 may further include other various components related to memory operations, for example, a voltage generator, a write driver, and a sense amplifier.

The control logic 720 may control the memory operations according to various signals from a memory controller (not shown). For example, the control logic 720 may receive an address ADD from the memory controller, provide a row address for selecting word lines of the memory cell array 711 to the row decoder 712, and provide a column address for selecting bit lines of the memory cell array 711 to the column decoder 713. In addition, the control logic 720 may include a command decoder 721 that decodes a command CMD from the memory controller to control operations in the memory device 700.

According to example embodiments of the inventive concept, information corresponding to the command CMD and the address ADD may be provided from a test logic to the memory device 700 as a test input (e.g., a first test input) in a test environment for the memory device 700. In addition, information corresponding to data DATA may be provided to the memory device 700 as a test input (e.g., a second test input). In a test environment, each of the first test input and the second test input may be provided to a target circuit in the memory device 700 via a DFT buffer and a timing control circuit, according to the embodiments described above. As an example, the first test input may be provided to the control logic 720 after being delayed by a certain delay amount through a DFT buffer 741 and a timing control circuit 742, and the second test input may be provided to the data buffer 730 after being delayed by a certain delay amount through a DFT buffer 751 and a timing control circuit 752.

In a test mode, the memory device 700 may perform signal processing using the first test input and the second test input and generate a test output and provide the test output to an external test logic. In addition, the memory device 700 may receive a command/address CMD/ADD and data DATA for a memory operation in a normal mode via a command address (CA) buffer 743 and a data buffer 753, respectively, and received signals may be provided to circuit blocks in the memory device 700 without delay processing. FIG. 15 illustrates a configuration in which pads and buffers for receiving various types of information in a test mode are provided separately from pads and buffers for receiving various types of information in a normal mode. However, as in the embodiment as described above, the memory device 700 may have a configuration in which pads and buffers are shared in the test mode and the normal mode.

While the inventive concept has been particularly shown and described with reference to embodiments thereof, it will be understood that various changes in form and details may be made therein without departing from the spirit and scope of the following claims.

What is claimed is:

1. A test device, comprising:
a test mounting circuit having a plurality of semiconductor devices mounted thereon as respective devices-under-test that comprise corresponding delay control circuits and target circuits therein; and
test logic electrically coupled to said test mounting circuit, said test logic configured to generate a test input(s), which is provided in parallel to the delay control circuits within the plurality of devices-under-test, said delay control circuits comprising at least first and second delay control circuits configured to pass the test input(s) to corresponding first and second target circuits during respective first and second test time intervals that are out-of-phase relative to each other, by delaying the test input(s) that is passed to the second target circuit relative to the test input(s) that is passed to the first target circuit so that testing of the second target circuit is delayed relative to the first target circuit;
wherein the first target circuit includes a first memory cell array and the second target circuit includes a second memory cell array;
wherein a timing at which the test input(s) is written into the first memory cell array is different from a timing at which the test input(s) is written into the second memory cell array; and
wherein the test logic is configured to provide a delay control signal to the plurality of semiconductor devices to set different delay amounts for the test input(s).

2. The test device of claim 1, wherein the first and second delay control circuits receive the same test input(s) at the same time from said test logic, yet provide the test input(s) to the first and second target circuits at different times so that a first test mode is commenced within the first target circuit using the test input(s) before a second test mode is commenced within the second target circuit using the test input(s).

3. The test device of claim 2, wherein the first delay control circuit comprises a timing control circuit that delays a passing of the test input(s) through the first delay control circuit and to the first target circuit by a programmable first delay amount.

4. The test device of claim 3, wherein the first delay control circuit is configured to bypass the timing control circuit when output test data generated by the first target circuit is passed through the first delay control circuit.

5. The test device of claim 2, wherein the first delay control circuit comprises a first timing control circuit that delays passing of a plurality of portions of the test input(s) therethrough and to the first target circuit by a corresponding plurality of unequal delay amounts.

6. A test device, comprising:
a device under test (DUT) mounting circuit on which a plurality of semiconductor devices are mounted as a DUT; and
a test logic configured to generate a test input provided to target circuits in the plurality of semiconductor devices and determine whether the DUT is defective based on a test output from the plurality of semiconductor devices,
wherein the test logic is configured to provide: (i) the test input to the plurality of semiconductor devices in parallel, and (ii) a delay control signal to the plurality of semiconductor devices to set different delay amounts for the test input; and
wherein, based on a control by the test logic, a timing at which the test input is delivered to target circuits in some of the plurality of semiconductor devices is different from a timing at which the test input is delivered to target circuits in some other semiconductor devices because an additional programmable delay(s) is added to the test input that is delivered to the target circuits in the some other semiconductor devices relative to the test input that is delivered to the target circuits in the some of the plurality of semiconductor devices.

7. The test device of claim 6, wherein each of the plurality of semiconductor devices comprises a delay control circuit that receives the test input, delays the test input, and outputs a delayed test input, and
wherein the test logic is configured to provide a delay control signal to the plurality of semiconductor devices to set different delay amounts for the test input.

8. The test device of claim 6, wherein the plurality of semiconductor devices are classified into first to N-th groups (where N is an integer that is equal to or greater than 2), each of the first to N-th groups including one or more semiconductor devices, wherein target circuits in semiconductor devices belonging to a same group simultaneously receive the test input, and target circuits in semiconductor devices belonging to different groups receive the test input at different timings.

9. The test device of claim 6, wherein the plurality of semiconductor devices comprise M semiconductor devices (where M is an integer that is equal to or greater than 2), wherein target circuits in the M semiconductor devices receive the test input at different timings.

10. The test device of claim 6, wherein the plurality of semiconductor devices comprise a first semiconductor device, the first semiconductor device including a plurality of channels each receiving the test input via an independent interface, wherein target circuits in the plurality of channels receive the test input at different timings.

11. The test device of claim 10, wherein the first semiconductor device comprises a high bandwidth memory (HBM).

12. The test device of claim 6, wherein the plurality of semiconductor devices comprise semiconductor packages, wherein the test logic is on a test board including the DUT mounting circuit.

13. The test device of claim 6, wherein the plurality of semiconductor devices comprise dies formed in a semiconductor wafer, wherein the test logic is included in a probe card for testing the dies of the semiconductor wafer.

\* \* \* \* \*